(12) United States Patent  
Masuda

(10) Patent No.: US 8,430,962 B2  
(45) Date of Patent: Apr. 30, 2013

(54) GAS SUPPLY DEVICE, SUBSTRATE PROCESSING APPARATUS AND SUBSTRATE PROCESSING METHOD

(75) Inventor: Noriiki Masuda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 765 days.

(21) Appl. No.: 12/262,698

(22) Filed: Oct. 31, 2008

(65) Prior Publication Data

US 2009/0117746 A1 May 7, 2009

Related U.S. Application Data

(60) Provisional application No. 61/024,346, filed on Jan. 29, 2008.

(30) Foreign Application Priority Data

Nov. 2, 2007 (JP) ................................. 2007-286411

(51) Int. Cl.
| | |
|---|---|
| C23C 16/455 | (2006.01) |
| C23C 16/46 | (2006.01) |
| C23C 16/52 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC ........... 118/715; 118/724; 118/725; 118/663; 118/696; 156/345.24; 156/345.33; 156/345.34; 156/345.52; 156/345.53

(58) Field of Classification Search ................ 118/715, 118/724, 725, 663, 696; 156/345.24, 345.33, 156/345.34, 345.52, 345.53
See application file for complete search history.

(56) References Cited

U.S. PATENT DOCUMENTS 5,500,256 A 3/1996 Watabe
(Continued)

FOREIGN PATENT DOCUMENTS

| CN | 1787170 A | 6/2006 |
|---|---|---|
| JP | 7-142449 A | 6/1995 |

(Continued)

OTHER PUBLICATIONS

Office Action issued Apr. 12, 2012, in Chinese Patent Application No. 200810173055.7.

Primary Examiner — Rudy Zervigon
(74) Attorney, Agent, or Firm — Rothwell, Figg, Ernst & Manbeck, P.C.

(57) ABSTRACT

A gas supply mechanism includes a gas introduction member having gas inlet portions through which a gas is introduced into a processing chamber, a processing gas supply unit, a processing gas supply path, branch paths, an additional gas supply unit and an additional gas supply path. The gas inlet portions includes inner gas inlet portions for supplying the gas toward a region where a target substrate is positioned in the chamber and an outer gas inlet portion for introducing the gas toward a region outside an outermost periphery of the target substrate. The branch paths are connected to the inner gas inlet portions, and the additional gas supply path is connected to the outer gas inlet portion.

20 Claims, 12 Drawing Sheets

U.S. PATENT DOCUMENTS

| | | | |
|---|---|---|---|
| 5,589,002 A | 12/1996 | Su | |
| 5,877,090 A | 3/1999 | Padmapani et al. | |
| 5,958,140 A * | 9/1999 | Arami et al. | 118/725 |
| 6,009,830 A | 1/2000 | Li et al. | |
| 6,397,861 B1 | 6/2002 | Wing et al. | |
| 6,444,039 B1 | 9/2002 | Nguyen | |
| 6,537,419 B1 | 3/2003 | Kinnard | |
| 6,800,139 B1 | 10/2004 | Shinriki et al. | |
| 2005/0029369 A1 | 2/2005 | Nagaoka et al. | |
| 2005/0034674 A1 | 2/2005 | Ono | |
| 2006/0016559 A1 | 1/2006 | Kobayashi et al. | |
| 2006/0124169 A1 | 6/2006 | Mizusawa et al. | |
| 2007/0175391 A1 | 8/2007 | Mizusawa | |
| 2007/0181181 A1 | 8/2007 | Mizusawa | |
| 2007/0251642 A1 * | 11/2007 | Bera et al. | 156/345.26 |

FOREIGN PATENT DOCUMENTS

| | | |
|---|---|---|
| JP | 8-96987 A | 4/1996 |
| JP | 2000-28996 A | 1/2000 |
| JP | 2002-502553 A | 1/2002 |
| JP | 2002-155366 A | 5/2002 |
| JP | 2002-261036 A | 9/2002 |
| JP | 2005-723 A | 1/2005 |
| JP | 2006-41088 A | 2/2006 |
| JP | 2006-165399 | 6/2006 |
| JP | 2006-165399 A | 6/2006 |
| JP | 2007-207808 | 8/2007 |
| JP | 2007-214295 | 8/2007 |
| JP | 2007-214295 A | 8/2007 |
| WO | 2007/081686 A2 | 7/2007 |

* cited by examiner

GAS SUPPLY DEVICE, SUBSTRATE PROCESSING APPARATUS AND SUBSTRATE PROCESSING METHOD

FIELD OF THE INVENTION

The present invention relates to a gas supply device for supplying a gas into a processing chamber when a substrate is subjected to a substrate processing such as plasma etching or the like, a substrate processing apparatus including the gas supply device and a substrate processing method.

BACKGROUND OF THE INVENTION

In a manufacturing process of electronic devices such as semiconductor devices and liquid crystal displays, a substrate processing, e.g., film-forming processing for forming a predetermined film on the surface of a substrate or an etching processing for forming specific patterns to a film formed on a substrate is performed.

In the substrate processing, a plasma is used to obtain high reactivity. In particular, a plasma etching apparatus is frequently used in the etching processing. The plasma etching apparatus includes a processing chamber having a substrate therein, a lower electrode provided in the processing chamber for mounting the substrate thereon and an upper electrode provided in the processing chamber to face with the lower electrode, the upper electrode forming a shower head for injecting a gas toward the substrate mounted on the lower electrode. In this plasma etching apparatus, a specific gaseous mixture is injected through the shower head and a high frequency electric field is formed between the lower and upper electrodes to generate a plasma. The film formed on the substrate is etched by the plasma.

In the plasma etching apparatus, the etching characteristics such as an etching rate and an etching selectivity are affected by the concentration of the gas supplied onto the substrate. In an effort to make the etching characteristics uniform in the substrate plane, there have been proposed various methods for adjusting the gas distribution in the substrate plane.

For example, Japanese Patent Laid-open Publication No. 2006-165399 (JP2006-165399A) discloses a technique in which the gas distribution is adjusted by supplying an arbitrary gaseous mixture to a plurality of locations in a processing chamber with a relatively simple line configuration. Japanese Patent Laid-open Publication No. 2007-207808 (JP2007-207808A) discloses a technique in which the gas distribution is adjusted by supplying an arbitrary gaseous mixture to a plurality of locations in a processing chamber with a simple line configuration and through a simple control operation, wherein a processing gas is split to flow through first and second paths so that it can be injected from first and second portions of a shower head, respectively. Further, a specific additional gas is allowed to flow through these paths, thereby adjusting the ingredient and flow rate of the processing gas. Japanese Patent Laid-open Publication No. 2007-214295 (JP2007-214295A) discloses a technique in which the gas distribution is adjusted by supplying an arbitrary gaseous mixture to a plurality of locations in a processing chamber with a simple line configuration and through a simple control operation, wherein a processing gas is split to flow through first and second paths so that it can be injected from first and second portions of a shower head. Independently of the processing gas, a specific additional gas is injected to thereby adjust the ingredient and flow rate of the processing gas with an increased degree of freedom.

However, requirements for in-plane uniformity of the substrate become more and more strict. In particular, it is difficult to correct the characteristics of an outermost circumference of a peripheral edge of the substrate. Therefore, it sometimes happens that the in-plane uniformity is not sufficiently secured by merely employing the techniques mentioned above. Further, there happens sometimes that the additional gas is not needed depending on the process. In case where an additional gas line is separately provided as in JP2007-214295A, there is a possibility that, if the additional gas is not supplied, a deposit may be accumulated in injection holes through which the additional gas is to be injected and an abnormal electric discharge may be generated in the vicinities of the injection holes.

SUMMARY OF THE INVENTION

In view of the above, it is an object of the present invention to provide a gas supply device capable of effectively correcting the characteristics of an outermost circumference of a substrate while employing a simple line configuration.

Another object of the present invention is to provide a substrate processing apparatus and a substrate processing method capable of performing uniform in-plane processing to a substrate by effectively correcting the characteristics of an outermost circumference of the substrate.

Still another object of the present invention is to provide a gas supply device, a substrate processing apparatus and a substrate processing method, each of which is capable of supplying an additional gas in addition to a processing gas and each of which seldom generates a deposit and an abnormal electric discharge even when the additional gas is not supplied.

In accordance with a first aspect of the present invention, there is provided a gas supply mechanism for supplying a gas into a processing chamber in which a target substrate is arranged.

The gas supply mechanism includes a gas introduction member provided in the processing chamber to face with the target substrate, the gas introduction member having gas inlet portions through which a gas is introduced into the processing chamber; a processing gas supply unit for supplying a processing gas into the gas introduction member, the processing gas being used for processing the target substrate; a processing gas supply path through which the processing gas flows from the processing gas supply unit; branch paths for supplying the processing gas in a specific split flow rate ratio, the branch paths being branched off from the processing gas supply path and connected to the gas introduction member; an additional gas supply unit for supplying an additional gas into the gas introduction member, the additional gas being used in adjusting processing characteristics of the processing gas; and an additional gas supply path connected to the additional gas supply unit and the gas introduction member.

The gas inlet portions include inner gas inlet portions for supplying a gas toward a region where the target substrate is positioned and an outer gas inlet portion for introducing a gas toward a region outside an outermost periphery of the target substrate, branch paths being connected to inner gas inlet portions, and the additional gas supply path being connected to the outer gas inlet portion.

In accordance with the first aspect, the gas inlet portions of the gas introduction member are preferably provided in a concentric pattern. The outer gas inlet portion is arranged in an outermost position, and inner gas inlet portions are arranged inside the outer gas inlet portion.

Further, the gas introduction member may form a shower head having an internal gas diffusion space and a bottom having gas injection holes, the gas diffusion space being divided into gas diffusion rooms to correspond to the gas inlet portions.

Furthermore, the gas inlet portions may include a first gas inlet portion for introducing the processing gas toward a central region of the target substrate, a second gas inlet portion for introducing the processing gas toward a peripheral region of the target substrate, and a third gas inlet portion arranged outside the second gas inlet portion, the first and the second gas inlet portion serve as the inner gas inlet portions and the third gas inlet portion serves as the outer gas inlet portion.

The branch paths may include a first branch path and a second branch path respectively connected to the first and the second gas inlet portion.

The gas supply mechanism may further includes a switching mechanism capable of selectively supplying the additional gas and the processing gas to the outer gas inlet portion.

The switching mechanism preferably includes a bypass line connecting the additional gas supply path to either the processing gas supply path or one of the branch paths and a bypass valve for selectively connecting the outer gas inlet portion to either the additional gas supply path or the bypass line.

In accordance with a second aspect of the present invention, there is provided a gas supply mechanism for supplying a gas into a processing chamber in which a target substrate is arranged. The gas supply mechanism includes a processing gas supply unit for supplying a processing gas into the processing chamber, the processing gas being used in processing the target substrate; one or more processing gas inlet portions through which the processing gas is introduced into the processing chamber; a processing gas supply path through which the processing gas is supplied from the processing gas supply unit to the processing gas inlet portion; and an additional gas supply unit for supplying an additional gas into the processing chamber.

The gas supply mechanism further includes the additional gas being used in adjusting processing characteristics of the processing gas; an additional gas inlet portion through which a gas is introduced into the processing chamber; an additional gas supply path through which the additional gas is supplied from the additional gas supply unit to the additional gas inlet portion; and a switching mechanism for allowing the processing gas to flow through the additional gas inlet portion in case where the additional gas is not introduced into the processing chamber.

In accordance with the second aspect, the switching mechanism preferably includes a bypass line connecting the additional gas supply path and the processing gas supply path and a bypass valve for selectively connecting the additional gas inlet portion to either the additional gas supply path or the bypass line.

In accordance with the second aspect, the processing gas supply path preferably includes a main path extending from the processing gas supply unit and branch paths branched off from the main path, the number of the processing gas inlet portions being greater than one to correspond with the branch paths.

In this case, the processing gas inlet portions and the additional gas inlet portion preferably form a gas introduction member provided inside the processing chamber to face with the target substrate.

The gas introduction member preferably constitutes a shower head having an internal gas diffusion space and a bottom having gas injection holes, the gas diffusion space being divided into gas diffusion rooms to correspond to the processing gas inlet portions and the additional gas inlet portion.

Further, the processing gas inlet portions preferably includes a first gas inlet portion for introducing the processing gas toward a central region of the target substrate and a second gas inlet portion for introducing the processing gas toward a peripheral region of the target substrate, the additional gas inlet portion being arranged outside the second gas inlet portion and supplying the additional or the processing gas toward a region outside an outermost periphery of the target substrate.

In accordance with the first and the second aspect, the additional gas may differ from the processing gas. The processing gas preferably includes plural gases, the additional gas differing from the gases or being a part of the gases which form the processing gas.

In accordance with a third aspect of the present invention, there is provided a substrate processing apparatus including a processing chamber in which a target substrate is arranged, and a gas supply mechanism for supplying a gas into the processing chamber, wherein a processing gas used for processing the target substrate is supplied from the gas supply mechanism into the processing chamber to perform a specific processing onto the target substrate.

The gas supply mechanism includes a gas introduction member provided in the processing chamber to be faced with the target substrate, the gas introduction member having gas inlet portions through which a gas is introduced into the processing chamber; a processing gas supply unit for supplying the processing gas into the gas introduction member; a processing gas supply path through which the processing gas flows from the processing gas supply unit; and branch paths for supplying the processing gas in a specific split flow rate ratio.

The gas supply mechanism further includes the branch paths branched off from the processing gas supply path and connected to the plurality of gas inlet portions of the gas introduction member; an additional gas supply unit for supplying an additional gas into the gas introduction member, the additional gas being used in adjusting processing characteristics of the processing gas; and an additional gas supply path through which the additional gas flows from the additional gas supply unit, the additional gas supply path connected to the gas introduction member.

The gas introduction member includes an outer gas inlet portion for introducing a gas toward a region outside an outermost periphery of the target substrate, and the additional gas supply path being connected to the outer gas inlet portion.

In accordance with a fourth aspect of the present invention, there is provided a substrate processing apparatus including a processing chamber in which a target substrate is arranged, and a gas supply mechanism for supplying a gas into the processing chamber, wherein a processing gas used in processing the target substrate is supplied from the gas supply mechanism into the processing chamber to perform a specific processing onto the target substrate.

The gas supply mechanism includes a processing gas supply unit for supplying the processing gas into the processing chamber, the processing gas being used for processing the target substrate; one or more processing gas inlet portions through which the processing gas is introduced into the processing chamber; a processing gas supply path through which the processing gas is supplied from the processing gas supply unit to the processing gas inlet portion; an additional gas supply unit for supplying an additional gas into the processing chamber, the additional gas being used in adjusting processing characteristics of the processing gas; and an additional gas inlet portion through which a gas is introduced into the processing chamber.

The gas supply mechanism further includes an additional gas supply path through which the additional gas is supplied from the additional gas supply unit to the additional gas inlet portion; and a switching mechanism for allowing the processing gas to flow through the additional gas inlet portion in case where the additional gas is not introduced into the processing chamber.

In accordance with the third and the fourth aspect, the substrate processing apparatus may further includes a plasma generation mechanism for generating a plasma of the processing gas and the additional gas to process the target substrate with the plasma thus generated.

In accordance with a fifth aspect of the present invention, there is provided a substrate processing method for performing a specific processing on a target substrate by introducing a processing gas into a processing chamber in which the target substrate is arranged. The substrate processing method further includes supplying the processing gas in a specific split flow rate ratio from portions toward a region where the target substrate is positioned; and supplying an additional gas, used for adjusting processing characteristics of the processing gas, from an outer portion outside the portions to a region outside an outermost periphery of the target substrate.

In accordance with the fifth aspect, the portions are provided in a concentric pattern, the outermost peripheral region being concentrically arranged outside the portions. In this case, the portions include a first portion corresponding to a central region of the target substrate and a second region corresponding to a peripheral region of the target substrate.

Further, in accordance with the fifth aspect of the present invention, the specific processing preferably includes plasma processing for plasma-etching a film formed on the target substrate. In case where a reaction product is decreased in an outermost periphery region of the target substrate in the processing chamber, the additional gas may a gas including an ingredient for generating the reaction product.

Furthermore, in case where an ingredient of a film to be etched is decreased in an outermost periphery region of the target substrate within the processing chamber, the additional gas may include a gas for generating the ingredient of the film.

In accordance with the sixth aspect of the present invention, there is provided a substrate processing method for performing a specific processing on a target substrate by introducing a processing gas into a processing chamber in which the target substrate is arranged.

The method includes: processing the target substrate by introducing the processing gas from a processing gas inlet portion into the processing chamber toward a region where the target substrate is positioned and by introducing an additional gas, used for adjusting processing characteristics of the processing gas, from an additional gas inlet portion into the processing chamber; and processing the target substrate by introducing the processing gas from the processing gas inlet portion into the processing chamber toward the region where the target substrate is positioned, without introducing the additional gas into the processing chamber.

The processing onto the target substrate without introducing the additional gas into the processing chamber is performed while supplying the processing gas via the additional gas inlet portion.

In the present invention, the gas introduction member provided in the processing chamber includes a plurality of inner gas inlet portions and an outer gas inlet portion. The processing gas is supplied from the plurality of inner gas inlet portions to the target substrate arrangement region in a controlled split flow rate ratio. The additional gas for adjusting the processing characteristics of the processing gas is allowed to flow from the outer gas inlet portion to the region outside the outermost periphery of the target substrate. These features make it possible to efficiently correct and optimize the processing characteristics in the outermost circumferential region of the target substrate, thus making the processing characteristics more uniform. In other words, it is difficult to correct the processing characteristics of the outermost circumferential region of the target substrate even though the additional gas is supplied to the edge region of the target substrate. However, if the additional gas is supplied to the region outside the outermost periphery of the target substrate, the additional gas acts effectively on the outermost circumferential region of the target substrate. This makes it possible to correct the processing characteristics of the outermost circumferential region.

Furthermore, the present gas supply device is provided with the processing gas inlet portion for introducing the processing gas into the processing chamber and the additional gas inlet portion for introducing the additional gas into the processing chamber, so that the processing gas and the additional gas can be supplied to the target substrate. The gas supply device is further provided with the switching mechanism for switching, when the additional gas is not introduced into the processing chamber, the path in such a manner as to allow the processing gas to flow through the additional gas inlet portion. These features allow the processing gas to flow through the additional gas inlet portion in case of not introducing the additional gas. This makes it possible to eliminate the possibility that no gas flows through the gas injection holes of the additional gas inlet portion during the course of processing. As a consequence, it is possible to avoid generation of a deposit in the gas injection holes of the additional gas inlet portion. In case of plasma processing, it is possible to prevent an abnormal electric discharge from being generated in the gas injection holes.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
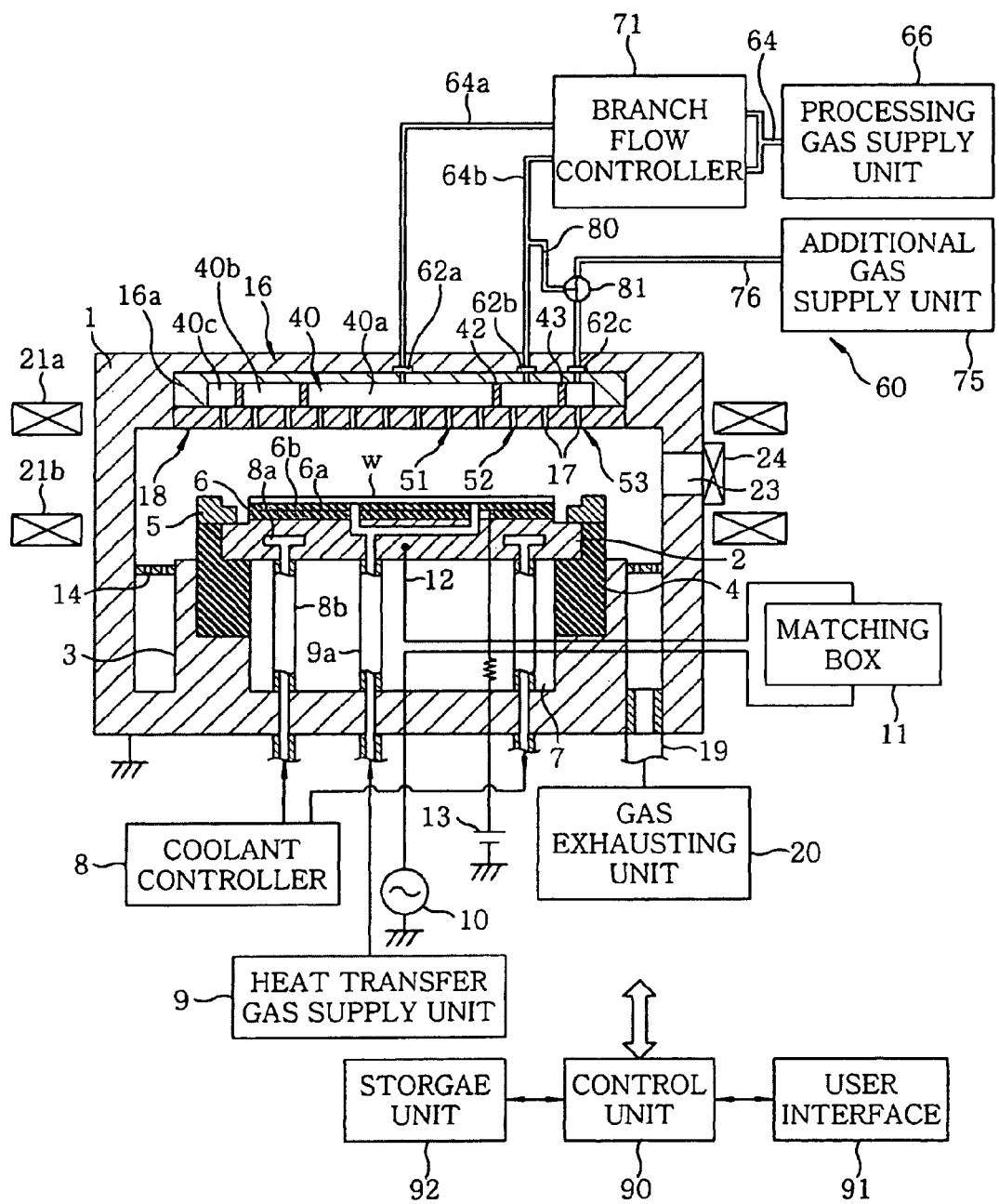
FIG. 1 is a schematic cross sectional view showing a plasma etching apparatus as a substrate processing apparatus to which a gas supply device is applied in accordance with one embodiment of the present invention.
Figure 2:
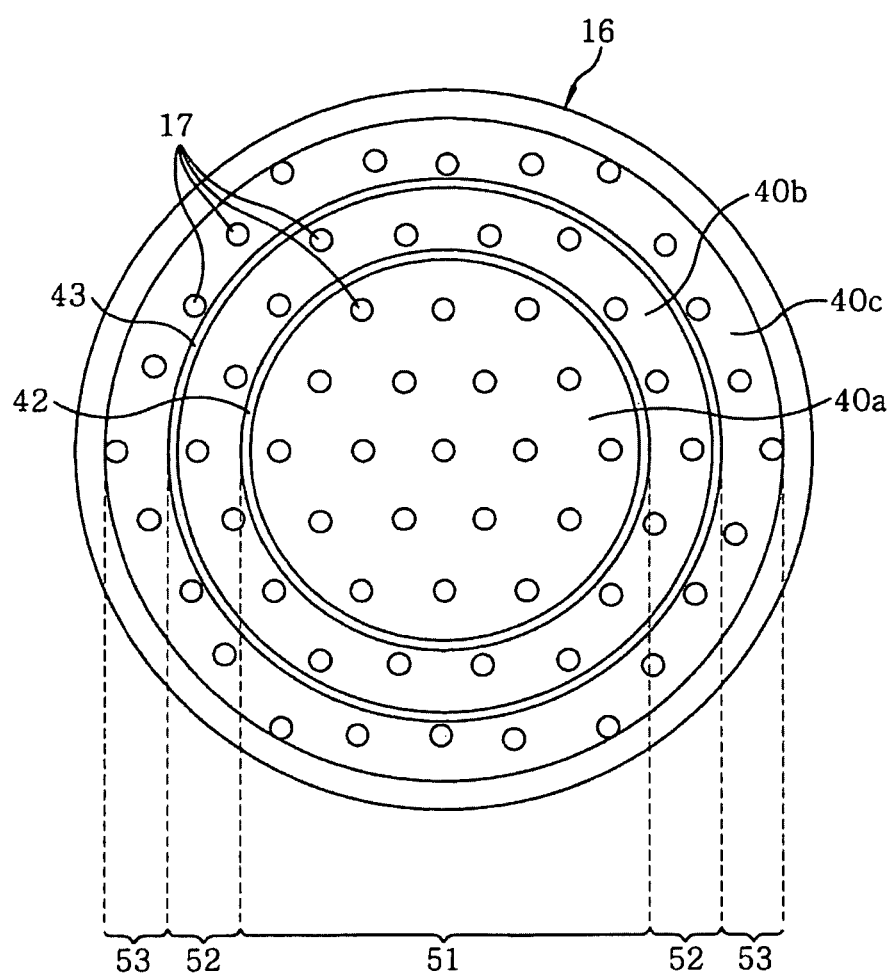
FIG. 2 is a bottom plan view showing a shower head employed in the plasma etching apparatus shown in FIG. 1.

Hereinafter, an embodiment of the present invention will be described with reference to the accompanying drawings which form a part hereof. FIG. 1 is a schematic cross sectional view showing a plasma etching apparatus as a substrate processing apparatus to which a gas supply device is applied in accordance with an embodiment of the present invention. FIG. 2 is a bottom plan view showing a shower head employed in the plasma etching apparatus shown in FIG. 1.

The plasma etching apparatus is a capacitively coupled parallel plate type plasma etching apparatus. The plasma etching apparatus includes a substantially cylindrical airtight chamber 1 of which wall is formed of, e.g., an aluminum material having an oxidized surface. The chamber 1 is electrically grounded.

In the chamber 1, there is provided a support table 2 for horizontally supporting a semiconductor wafer (hereinafter simply referred to as a "wafer") W as a target substrate to be processed, the support table 2 serving as a lower electrode. The support table 2 is formed of, e.g., an aluminum material having an oxidized surface and is supported via an insulation member 4 on a support base 3 extending upward from a bottom portion of the chamber 1. A focus ring 5 made of a conductive material or an insulating material is provided on an outermost periphery of the support table 2. A baffle plate 14 is provided outside the focus ring 5. A cavity 7 is formed between the support table 2 and the bottom portion of the chamber 1.

On the surface of the support table 2, there is provided an electrostatic chuck 6 for electrostatically attracting the wafer W. The electrostatic chuck 6 is formed of an electrode 6a interposed between insulation bodies 6b. A DC power supply 13 is connected to the electrode 6a. As a voltage is applied from the power supply 13 to the electrode 6a, the wafer W is attracted to the electrostatic chuck 6 by, e.g., Coulomb force.

A coolant path 8a is formed in the support table 2 and a coolant line 8b is connected to the coolant path 8a. Under the control of a coolant controller 8, an appropriate coolant is supplied to the coolant path 8a through the coolant line 8b and is circulated through the coolant path 8a and the coolant line 8b. This makes it possible to control the support table 2 to be maintained at a desirable temperature. Also provided is a heat transfer gas line 9a for supplying a heat transfer gas, e.g., a He gas, to a space between the front surface of the electrostatic chuck 6 and the rear surface of the wafer W. A heat transfer gas supply unit 9 is provided to supply the heat transfer gas to the rear surface of the wafer W via the heat transfer gas line 9a. This makes it possible to efficiently transfer the cold heat of the coolant circulating through the coolant path 8a to the wafer W even though the chamber 1 is evacuated and kept vacuum, thereby improving the temperature control of the wafer W.

A power supply wire 12 for supplying a high frequency power is connected to a substantially central portion of the support table 2. A matching box 11 and a high frequency power supply 10 are connected to the power supply wire 12. A high frequency power of a specific frequency, e.g., 100 MHz or more, is supplied from the high frequency power supply 10 to the support table 2. A shower head 16 to be described later is arranged above the support table 2 serving as a lower electrode in a parallel facing relationship therewith. The shower head 16 is electrically grounded via the chamber 1. Therefore, the shower head 16 serves as an upper electrode and forms a pair of parallel plate electrodes together with the support table 2.

The shower head 16 is engaged to the ceiling wall of the chamber 1. The shower head 16 includes a first gas inlet portion 51 for introducing a gas toward a wafer center region (central region) within the chamber 1, a second gas inlet portion 52 for introducing the gas toward a wafer periphery region (edge region) within the chamber 1 and a third gas inlet portion 53 for introducing the gas toward an outer region than the wafer periphery region. The first, second and third inlet portions 51, 52 and 53 are arranged in a concentric relationship with one another.

The shower head (gas introduction member) 16 includes a shower head body 16a and an electrode plate 18 detachably provided on the bottom surface of the shower head body 16a. A plurality of gas injection holes 17 is formed to penetrate the bottom wall of the shower head body 16a and the electrode plate 18. A gas diffusion space (internal gas diffusion space) 40 is provided in the shower head body 16a. By means of first and second annular partition wall members 42 and 43 each formed with, e.g., an O-ring, the gas diffusion space 40 is divided into gas diffusion rooms having a first gas diffusion space 40a positioned centrally, a second gas diffusion space 40b lying outside the first space 40a and a third (outermost) gas diffusion space 40c lying outside the second space 40b. The plurality of gas injection holes 17 extends downwardly from the first gas diffusion space 40a, the second gas diffusion space 40b and the third gas diffusion space 40c. The first gas inlet portion 51 is formed with the first gas diffusion space 40a and a plurality of gas injection holes 17 arranged just below the first space 40a. The second gas inlet portion 52 is formed with the second gas diffusion space 40b and a plurality of gas injection holes 17 arranged just below the second space 40b. The third gas inlet portion 53 is formed with the third gas diffusion space 40c and a plurality of gas injection holes 17 arranged just below the third space 40c.

A processing gas for use in an etching process is supplied into the first and second gas diffusion spaces 40a and 40b so that it can be injected toward the wafer W. An additional gas is supplied into the third gas diffusion space 40c. The gas injection holes 17 corresponding to the third gas diffusion space 40c are aligned with the region outside the outermost periphery of the wafer W mounted on the support table 2 so that the additional gas can be injected toward the region outside the outermost periphery of the wafer W.

A common processing gas supply unit 66 is designed to supply the processing gas into the first and second gas diffusion spaces 40a and 40b in a desired flow rate ratio. More specifically, a gas supply line (main path) 64 extends from the processing gas supply unit 66 and is bifurcated into two branch lines (branch paths) 64a and 64b which in turn are connected to gas inlet openings 62a and 62b formed at the shower head body 16a. The processing gas passing through the gas inlet openings 62a and 62b is led to the first and second gas diffusion spaces 40a and 40b. The branch flow rate of the processing gas flowing through the branch lines 64a and 64b is regulated by means of a branch flow controller 71 provided somewhere along the branch lines 64a and 64b.

An additional gas for use in adjusting the etching characteristics attained by the processing gas is supplied from an additional gas supply unit 75 into the third gas diffusion space 40c. The additional gas has a specific roll of, e.g., assuring uniform etching during an etching operation. A gas supply line (additional gas supply path) 76 extends from the additional gas supply unit 75 and is connected to a gas inlet opening 62c formed at the shower head body 16a. The additional gas passing through the gas inlet portion port 62c is led to the third gas diffusion space 40c. The shower head 16, the processing gas supply unit 66, the additional gas supply unit 75, the branch flow controller 71 and the piping system cooperate with one another to form a gas supply device (gas supply mechanism) 60.

Figure 3:
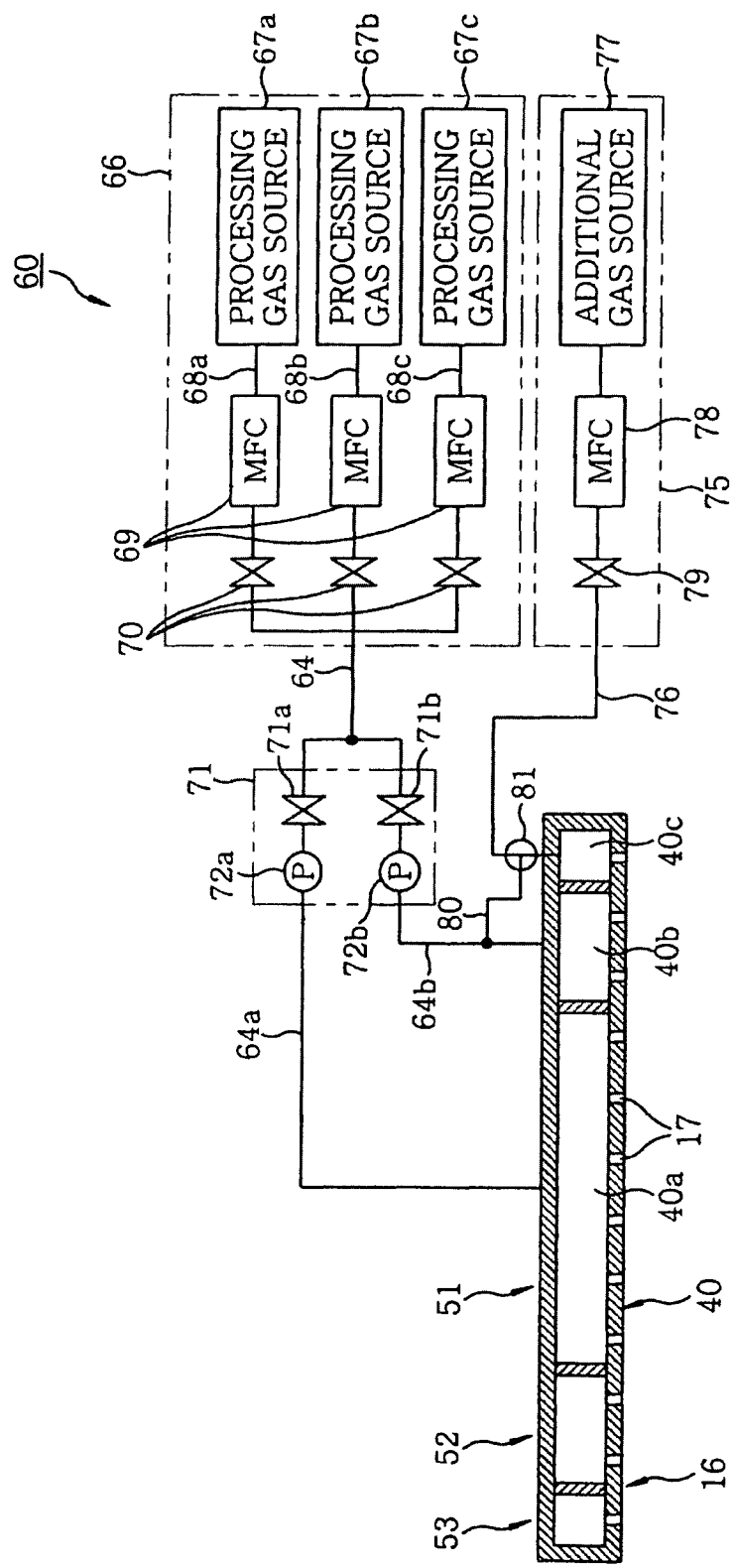
FIG. 3 is a pattern diagram illustrating a configuration of a gas supply device installed in the plasma etching apparatus shown in FIG. 1.

FIG. 3 is a schematic diagram illustrating a configuration of the gas supply device 60. The processing gas supply unit 66 includes a plurality of, e.g., three, processing gas sources 67a, 67b and 67c, the number of which varies depending on the kinds of processing gas used. Gas lines 68a, 68b and 68c respectively extend from the processing gas sources 67a, 67b and 67c. Mass flow controllers 69 serving as flow rate controllers and opening/closing valves 70 are arranged in the gas lines 68a, 68b and 68c so that plural kinds of processing gases can be respectively supplied at a desired flow rate. The gas lines 68a, 68b and 68c join the gas supply line 64. As a result, a gaseous mixture of the plural kinds of processing gases flows through the gas supply line 64. The number of the processing gas sources varies with the kinds of processing gases used and may be smaller than or greater than three.

The branch flow controller 71 includes flow rate control valves 71a and 71b and pressure sensors 72a and 72b arranged in the branch lines 64a and 64b. Since the paths extending from the processing gas supply unit 66 to the first and second gas diffusion spaces 40a and 40b have a same conductance, the flow rate ratio of the processing gases supplied into the first and second gas diffusion spaces 40a and 40b can be controlled at will with the flow rate control valves 71a and 71b. The flow rate is actually controlled by adjusting the opening degree of the flow rate control valves 71a and 71b based on detection values of the pressure sensors 72a and 72b.

The additional gas supply unit 75 includes an additional gas source 77 connected to the gas supply line 76, a mass flow controller 78 as a flow rate controller arranged in the gas supply line 76 and a opening/closing valve 79 also arranged in the gas supply line 76.

By controlling the flow rate ratio of the processing gases introduced into the first and second gas diffusion spaces 40a and 40b as mentioned above, it is possible to arbitrarily adjust the ratio Fc/Fe of the flow rate $F_c$ of the processing gas introduced from the first central gas inlet portion 51 into the chamber 1 and the flow rate Fe of the processing gas introduced from the second peripheral gas inlet portion 52 into the chamber 1. This makes it possible to perform radical distribution control. Independently of the processing gas, a specific additional gas may be introduced in a predetermined ratio with respect to the processing gas from the third gas diffusion space 40c of the third gas inlet portion 53 toward the region outside the outermost periphery of the wafer W in the chamber 1.

The gas supply line 76 for supplying the additional gas and the branch line 64b are connected to each other by a bypass line 80. A switching valve (bypass valve) 81 is arranged in the junction point of the gas supply line 76 and the bypass line 80. The switching valve 81 is formed of, e.g., a three-way valve. In case of supplying the additional gas, the switching valve 81 disconnects the third gas diffusion space 40c from the bypass line 80 so that the additional gas can be supplied into the third gas diffusion space 40c. In case of the additional gas not being supplied, the switching valve 81 disconnects the third gas diffusion space 40c from the additional gas supply unit 75 so that the processing gas can be supplied into the third gas diffusion space 40c through the bypass line 80. This eliminates the possibility that no gas flows through the gas injection holes 17 corresponding to the third gas diffusion space 40c even when the additional gas is not used in processing the wafer W.

An exhaust line 19 is connected to the bottom of the chamber 1 and a gas exhaust unit 20 including a vacuum pump is connected to the exhaust line 19. The inner space of the chamber 1 can be depressurized to a predetermined vacuum level by operating the vacuum pump of the gas exhaust unit 20. In an upper portion of a sidewall of the chamber 1, there is provided a gate valve 24 for opening and closing a loading/unloading port 23 through which the wafer W is loaded and unloaded.

Two annular magnets 21a and 21b are concentrically arranged above and below the loading/unloading port 23 of the chamber 1 so that they can be rotated around the chamber 1. The magnets 21a and 21b form magnetic fields around the processing space between the support table 2 and the shower head 16. The magnets 21a and 21b can be rotated by a rotating mechanism not shown in the drawings.

Components of the plasma etching apparatus, e.g., the processing gas supply unit 66, the split flow rate regulating mechanism 71, the additional gas supply unit 75, the high frequency power source 10, the matching box 11, the direct current source 13, the coolant controller 8, the heat transfer gas supply unit 9 and the exhaust unit 20, are connected to and controlled by a control unit (process controller) 90 which is a microprocessor (computer). Connected to the controller 90 is a user interface 91 that includes a keyboard for a process manager to input a command to operate the plasma etching apparatus, a display for showing an operational status of the plasma etching apparatus, and the like.

Also connected to the controller 90 is a storage unit 92 that stores therein, e.g., control programs to be used in realizing various processes, which are performed in the plasma processing apparatus under the control of the process controller 90, and/or a program, i.e., recipes, for making the components of the plasma etching apparatus perform processing tasks in accordance with processing conditions. The recipes are stored in a storage medium of the storage unit 92. The storage medium may be either a stationary one such as a hard disk or the like or a portable one such as a CDROM, a DVD or the like. Alternatively, the recipes may be suitably transmitted from another apparatus via, e.g., a dedicated line. If necessary, an arbitrary one of the recipes is called out from the storage unit 92 by inputting an instruction to that effect through the user interface 91. The controller 90 performs the recipe thus called out. Consequently, a desired processing task is carried out in the plasma etching apparatus under the control of the controller 90.

Next, description will be made on the processing operation of the plasma etching apparatus with the configuration as above. The processing operation is controlled by the controller 90 described above.

First, the gate valve 24 is opened and the wafer W is loaded into the chamber 1 by using a transfer arm. After the wafer W is mounted on the support table 2, the transfer arm is retracted and the gate valve 24 is closed. The inner space of the chamber 1 is evacuated through the exhaust line 19 to a predetermined vacuum level by using the vacuum pump of the exhaust unit 20.

Then, a processing gas for an etching operation is supplied from the processing gas supply unit 66 to the first gas diffusion space 40a and the second gas diffusion space 40b at a specific flow rate and in a specific ratio, thereby adjusting the ratio of the processing gas supplied into the first gas inlet portion 51 and the second gas inlet portion 52. A specific additional gas is supplied into the third gas diffusion space 40c of the third gas inlet portion 53. While supplying the processing gas and the additional gas into the chamber 1 through the gas injection holes 17, the chamber 1 is evacuated by the vacuum pump of the exhaust unit 20 to set the pressure in the chamber 1 to be within a range from 1 to 150 Pa.

In this regard, various kinds of conventionally available gases may be used as the processing gas. It is preferable to use, e.g., a gas including a halogen element, which is represented by a fluorocarbon gas ($C_xF_y$) such as a $C_4F_8$ gas or the like. Other gases such as an Ar gas and an $O_2$ gas may be used in combination with or in place of the gas including a halogen element.

The additional gas is used to increase the in-plane etching uniformity of the wafer by adjusting the etching environment around the portion of the wafer whose etching characteristics are peculiar. For example, it is sometimes the case that the linear shape of an etching film in a peripheral edge portion of the wafer becomes thin due to the small amount of by-product. In this case, it is effective that a gas capable of generating a by-product is supplied as the additional gas. As another example, it is sometimes the case that the linear shape of an etching film in an outermost periphery of the wafer becomes thin due to a shortage of a gas corresponding to a composition ingredient of a film. In this case, it is effective that the gas corresponding to the composition ingredient of the film is supplied as the additional gas. It is possible to use, as the additional gas, either a fraction of the processing gas or a gas other than the processing gas.

While the processing gas and the additional gas are introduced into the chamber 1 in this manner, a high frequency power having frequency of 10 MHz or more, e.g., 13.56 MHz is supplied from the high frequency power source 10 to the support table 2. At this time, a predetermined level of voltage is applied from the direct current source 13 to the electrode 6a of the electrostatic chuck 6, whereby the wafer W is adsorbed to the electrostatic chuck 6 by, e.g., Coulomb force.

As the high frequency power is applied to the support table 2 serving as the lower electrode in the manner as noted above, the high frequency electric field is formed in the processing space between the shower head 16, i.e., the upper electrode, and the support table 2, i.e., the lower electrode. Thus, the processing gas supplied into the processing space is turned to a plasma. An etching target film of the wafer W is etched by radicals or ions present in the plasma.

Depending on the kinds of processing to be performed, it would be possible to make the etching characteristics uniform by using the radical distribution control in which the flow rate of the processing gas is adjusted differently in the central region and the peripheral region of the wafer W or by allowing the additional gas to flow toward the peripheral region of the wafer W, as disclosed in JP2006-165399A, JP2007-207808A and JP2007-214295A mentioned earlier.

However, when etching a SiN film used as a hard mask layer or when etching an organic film such as an interlayer insulation film having a low dielectric constant, the outermost circumferential portion of the wafer W undergoes a sharp change in its etching characteristics, especially in its critical dimension (CD). More specifically, there is a tendency that the resist becomes thin in the outermost circumferential portion of the wafer W. In this case, the uniform etching characteristics may not be always attained by merely performing the radical distribution control or the additional gas supply with the hardware configurations as described in JP2006-165399A, JP2007-207808A and JP2007-214295A mentioned earlier.

In the present embodiment, the additional gas is introduced through the third gas inlet portion 53 toward the position outside the outermost periphery of the wafer W, in addition to the processing gas flowing through the first and second gas introduction portions 51 and 52 in a controlled flow rate ratio.

These features make it possible to efficiently correct and optimize the etching characteristics in the outermost circumferential portion of the wafer W, thus making the etching characteristics more uniform. In other words, it is difficult to correct the etching characteristics of the outermost circumferential portion of the wafer W even when the additional gas is supplied to the edge region of the wafer W. However, if the additional gas is supplied to the region outside the outermost peripheral portion of the wafer W, the additional gas acts effectively on the outermost peripheral portion of the wafer W. This makes it possible to correct the etching characteristics of the outermost circumferential portion.

Although the additional gas may diffuse toward the middle and central regions of the wafer W and may cause a change in the environment of these regions, the influence of the additional gas can be cancelled by adjusting the ratio of the processing gas supplied through the first gas inlet portion 51 and the second gas inlet portion 52.

Figure 4A:
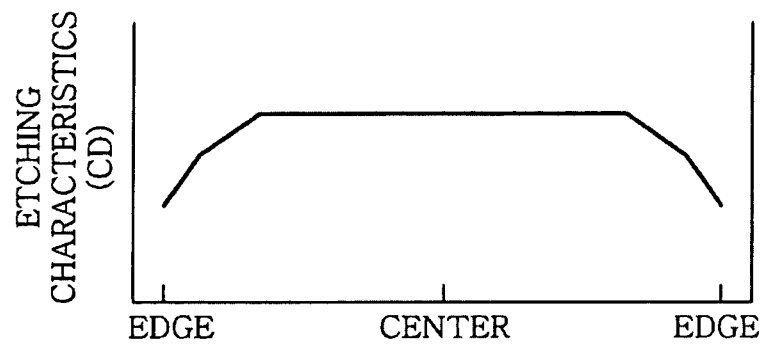
FIGS. 4A through 4D are views diagrammatically illustrating examples of etching characteristics corrected by the plasma etching apparatus shown in FIG. 1.
Figure 4B:
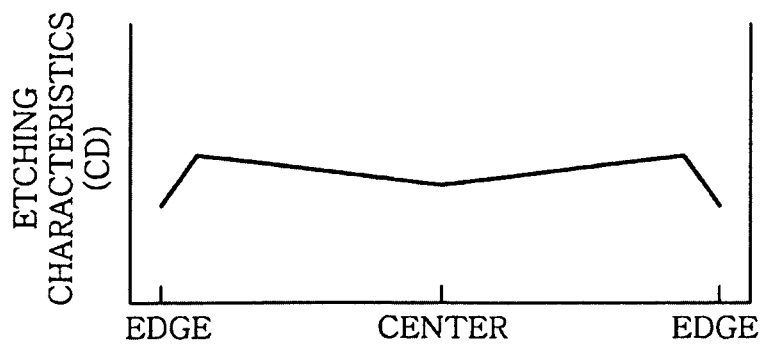
Figure 4C:
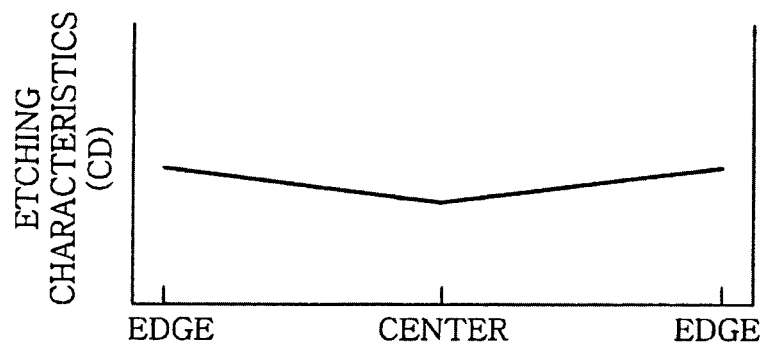
Figure 4D:
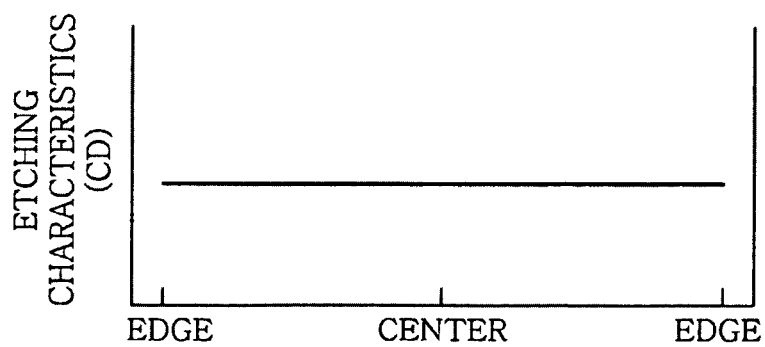

Such correction of the etching characteristics will be described in detail with reference to FIGS. 4A to 4D. In case where a $CH_2F_2$ gas, a $CF_4$ gas, an Ar gas and an $O_2$ gas are used as the processing gas while the additional gas is not used when etching, e.g., a SiN film, the etching critical dimension tends to sharply decrease beyond the middle region as illustrated in FIG. 4A. In case where a $CH_2F_2$ gas as the additional gas is supplied toward the edge region of the wafer W together with the processing gas, the critical dimension distribution is improved but the critical dimension of the outermost circumferential portion of the wafer W suffers from reduction, as illustrated in FIG. 4B. The critical dimension reduction in that portion is not improved even by controlling the spatial distribution of the radical density. In case where a $CH_2F_2$ gas as the additional gas is supplied toward the region outside the outermost peripheral portion of the wafer W as in the present embodiment, it becomes possible to optimize the critical dimension correction effect to the outermost circumferential portion of the wafer W as can be seen in FIG. 4C. The critical dimension reduction in the central region of the wafer W appeared in FIG. 4C can be dissolved as illustrated in FIG. 4D by adjusting the ratio of the processing gas supplied through the first and second gas introduction portions 51 and 52 and thus controlling the spatial distribution of the radical distribution. This makes it possible to remarkably increase the uniformity in the critical dimension. FIGS. 4A to 4D diagrammatically illustrate the general tendency of the change in the etching characteristics (critical dimension).

Depending on the process, there may be no need to use the additional gas. In this case, if the supply of the additional gas is merely stopped, no gas flows through the gas injection holes 17 corresponding to the third gas diffusion space 40c. If a plasma is generated in this state, the plasma enters the gas injection holes 17 corresponding to the third gas diffusion space 40c, thereby generating an abnormal electric discharge or a deposit in the gas injection holes 17.

In the present embodiment, the gas supply line 76 and the branch line 64b are connected to each other by the bypass line 80. The switching valve 81 is employed so that the additional gas and the processing gas can be selectively supplied to the third gas diffusion space 40c. In case where there is no need to supply the additional gas, the switching valve 81 is opened to the bypass line 80 so that the processing gas can flow into the third gas diffusion space 40c. This makes it possible to prevent the abnormal electric discharge or the deposit.

Next, description will be made on the experimental results that helped to develop the present invention.

Figure 5:
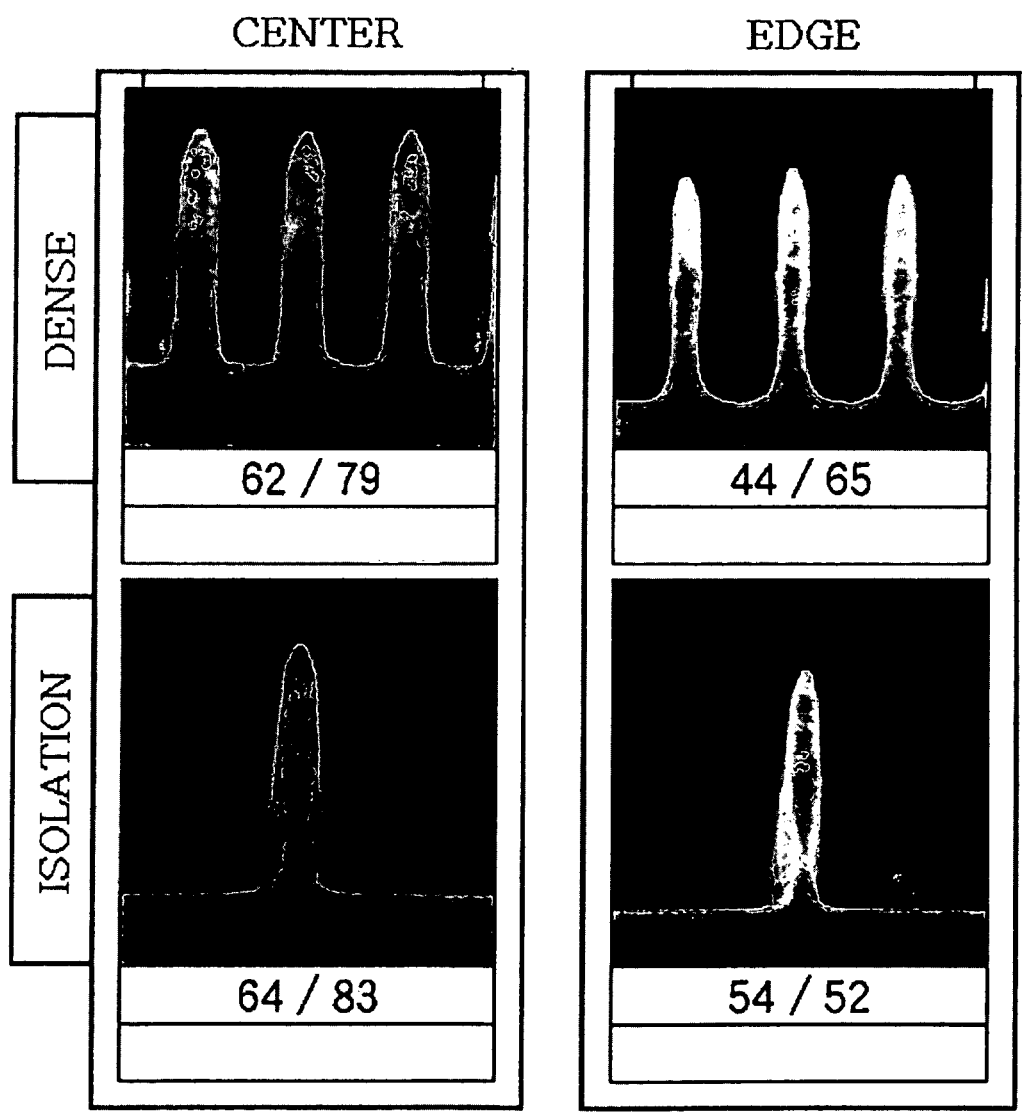
FIG. 5 shows scanning electron micrographs illustrating a status of etching patterns in a central region and a peripheral region in case where a SiN film is etched by the plasma etching apparatus shown in FIG. 1 without using an additional gas.

In one experiment, a 300 mm wafer was used, the wafer being obtained by laminating a SiN film of 200 nm, a polyvinyl alcohol-based resin film of 287 nm, an anti-reflection film of 80 nm and a photoresist film in that order on a Si substrate and then patterning the photoresist film into a critical dimension (line width) of 80 nm through a photolithography process. The outermost gas injection holes of the shower head 16 were arranged within the wafer arrangement region (up to 140 mm from the center). Except the above points, the same plasma etching apparatus as shown in FIG. 1 was used to etch the wafer down to the SiN film. At this time, a $CHF_3$ gas, a $CF_4$ gas, an Ar gas and an $O_2$ gas were used as the processing gas. The flow rates of the $CHF_3$, $CF_4$, Ar and $O_2$ gases were 30, 90, 600 and 15 mL/min (sccm), respectively. The flow rate ratio of the processing gas supplied toward the central region to the edge region was 45:55. The pressure in the chamber was 16.6 Pa (125 mTorr) and the high frequency power was 600 W. Etching was performed under these conditions. As a result, it was confirmed that the lines existing in the peripheral region became thinner than the lines of the central region both for the dense pattern portion and the isolative pattern portion, as can be seen from the scanning electron micrographs shown in FIG. 5. In the respective micrographs shown in FIG. 5, the left numerals signify the top critical dimension (nm) and the right numerals stand for the bottom critical dimension (nm).

Figure 6A:
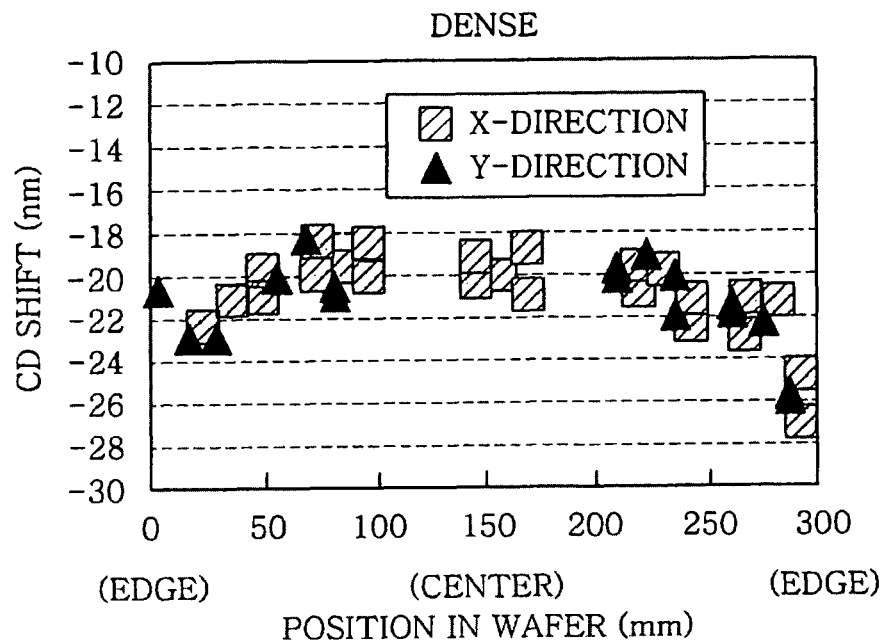
FIGS. 6A and 6B are views illustrating critical dimension shift amounts in a dense pattern portion and an isolative pattern portion along a radial direction of a wafer in case where a SiN film is etched by the plasma etching apparatus shown in FIG. 1 without using an additional gas.
Figure 6B:
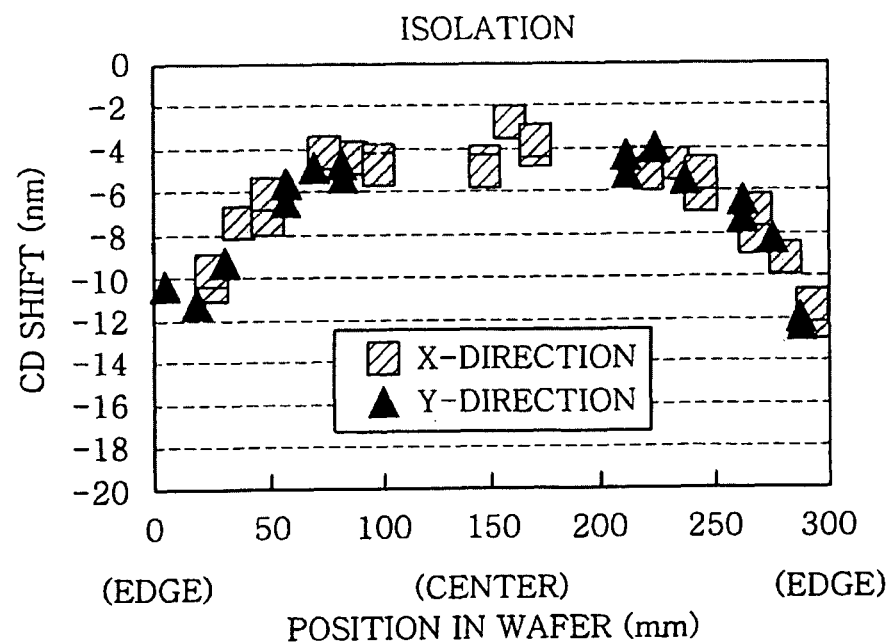

In another experiment, the same plasma etching apparatus as in the preceding experiment was used. At this time, a $CH_2F_2$ gas, a $CF_4$ gas, an Ar gas and an $O_2$ gas were used as the processing gas. The flow rates of the $CH_2F_2$, $CF_4$, Ar and $O_2$ gases were 20, 80, 150 and 21 mL/min (sccm), respectively. The flow rate ratio of the processing gas supplied toward the central region to the edge region was 45:55. The pressure in the chamber was 18.6 Pa (140 mTorr) and the high frequency power was 700 W. Under these conditions, the SiN film was etched to form lines having a critical dimension (line width) of 80 nm. Critical dimension shift amounts in a dense pattern portion and an isolative pattern portion along a radial direction of the wafer are illustrated in FIGS. 6A and 6B. It can be seen in FIGS. 6A and 6B that the critical dimension is decreased in the edge portion of the wafer.

Figure 7:
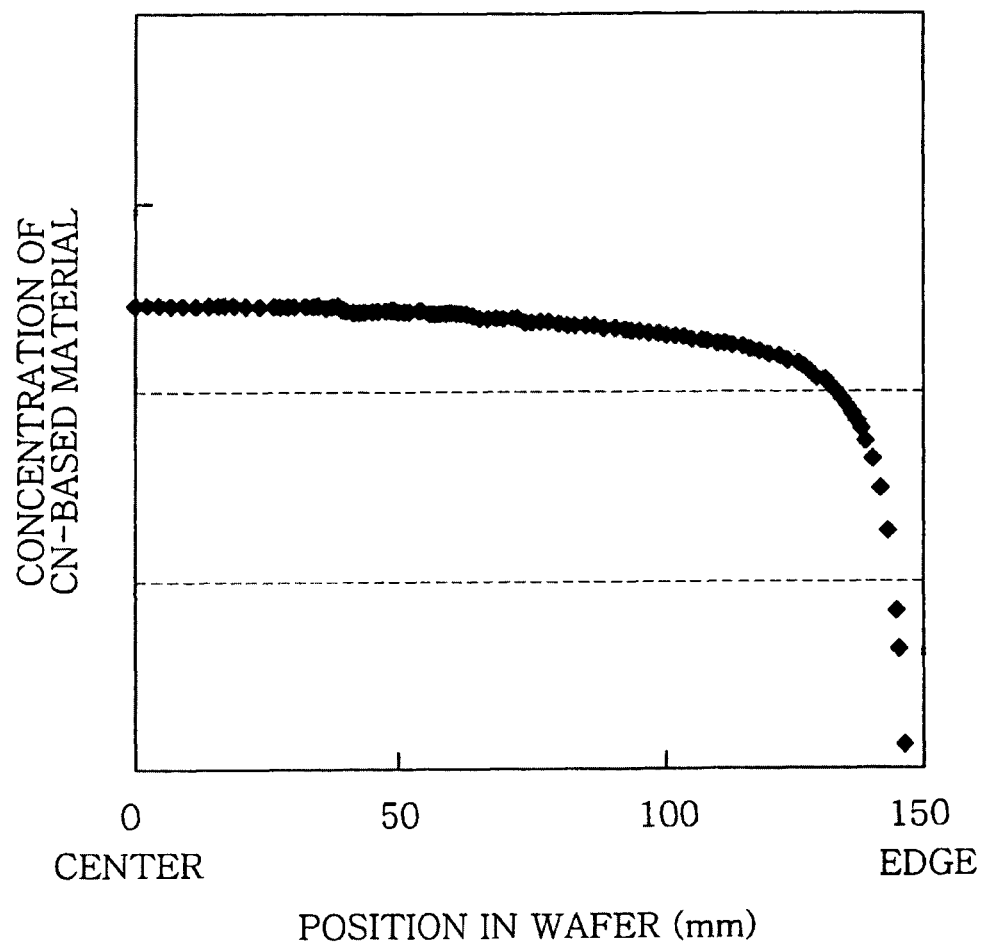
FIG. 7 is a view illustrating results of simulation for a concentration distribution of a CN-based material as a reaction product in case where a SiN film is etched by the plasma etching apparatus shown in FIG. 1 without using an additional gas.

Investigation on the indices having something to do with the critical dimension reduction in the edge portion of the wafer revealed that, as illustrated in FIG. 7, the critical dimension reduction was related to the concentration of a CN-based material as a reaction product (by-product) and the concentration of the reaction product was decreased in the edge portion of the wafer. FIG. 7 shows data acquired by conducting a simulation in positions 0.5 mm above the wafer. From the results illustrated in FIG. 7, it can be speculated that the critical dimension reduction results from the reduction in the concentration of the reaction product (CN-based material) in the wafer edge portion.

Figure 8A:
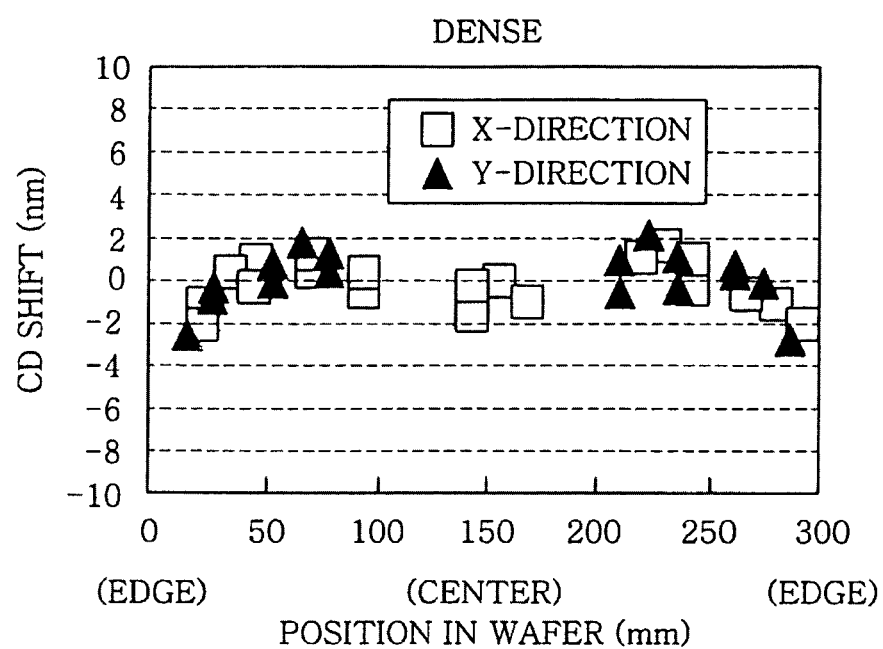
FIGS. 8A and 8B are views illustrating critical dimension shift amounts in a dense pattern portion and an isolative pattern portion along a radial direction of a wafer in case where a SiN film is etched by the plasma etching apparatus shown in FIG. 1 with a $CH_2F_2$ gas used as an additional gas.
Figure 8B:
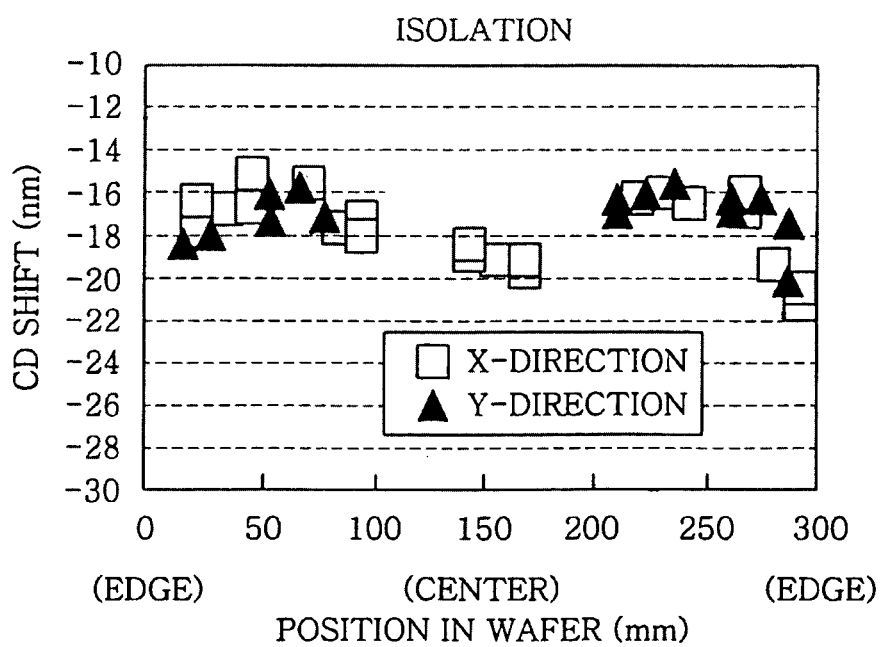

In another experiment, a plasma etching apparatus used in the above-described experiment was used in which the outermost gas injection holes of the shower head 16 were arranged within the wafer arrangement region (up to 140 mm from the center). A $CH_2F_2$ gas as an alternative of the CN-based material, i.e., the reaction product, was used as the additional gas. Simultaneously with supplying the processing gas, the $CH_2F_2$ gas was injected toward the edge portion of the wafer through the outermost gas injection holes (corresponding to the second gas diffusion space 40b of the plasma etching apparatus shown in FIG. 2). Critical dimension shift amounts in a dense pattern portion and an isolative pattern portion along a radial direction of the wafer available in this experiment are illustrated in FIGS. 8A and 8B. It can be seen in FIGS. 8A and 8B that the critical dimension reduction in the outermost circumferential portion of the wafer remains unsolved, although the critical dimension reduction in the wafer edge portion is mitigated and the uniformity of the critical dimension is improved by the additional gas.

Figure 9A:
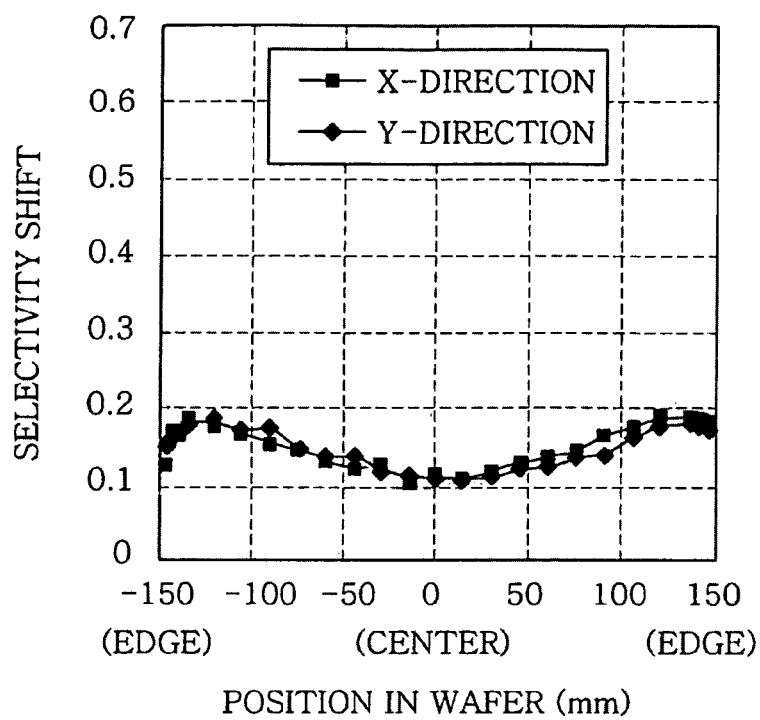
FIGS. 9A and 9B are views illustrating selectivity shift amounts along a radial direction of a wafer in case where a $CH_2F_2$ gas as an additional gas is supplied to an edge portion of a wafer and to a region outside the outermost periphery of the wafer when a SiN film is etched by the plasma etching apparatus shown in FIG. 1.
Figure 9B:
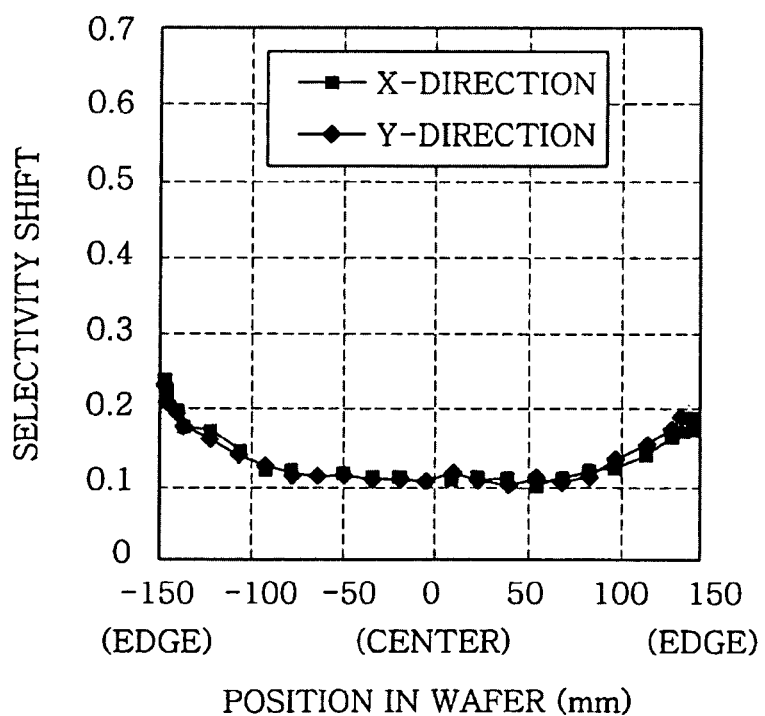

In the present invention, a $CH_2F_2$ gas as the additional gas was supplied toward the region outside the outermost periphery of the wafer (the region 156 mm away from the center). As a result, it was possible to correct the critical dimension reduction which would otherwise occur in the outermost periphery of the wafer. FIGS. 9A and 9B do not directly illustrate the critical dimension shift amounts but show shift amounts in the selectivity of the SiN film relative to the resist film, which have a strong correlation with the critical dimension shift amounts.

FIG. 9A illustrates the selectivity shift amounts in case where the $CH_2F_2$ gas as the additional gas was supplied toward the edge portion of the wafer, whereas FIG. 9B represents the selectivity shift amounts in case where the $CH_2F_2$ gas as the additional gas was supplied toward the region outside the peripheral region of the wafer. In FIG. 9A, the selectivity was decreased in the outermost circumferential region of the wafer. In FIG. 9B, however, the selectivity was increased to a maximum value in the outermost circumferential region of the wafer. In this state, the etching characteristics can be made uniform by the radical distribution control.

The above experiments were directed to a case where the etching characteristics in the wafer edge portion were affected by the concentration of the reaction product (by-product) present in the etching atmosphere. In some instances, the concentration of ingredients of a film has an influence on the etching characteristics in the wafer edge region. For example, during the process of etching an amorphous carbon film or an organic film, the concentration of carbon, i.e., one of the ingredients of the film, is reduced in the atmosphere around the wafer edge region. Consequently, there is a tendency that the critical dimension is decreased in the wafer edge region. In this case, a gas capable of increasing the concentration of carbon as one of the ingredients of the film, e.g., a CO gas, may be used as the additional gas. Use of such an additional gas helps make the etching characteristics such as the critical dimension and the like uniform.

Next, description will be made on examples in which the etching characteristics were actually made uniform in accordance with the present invention.

Figure 10:
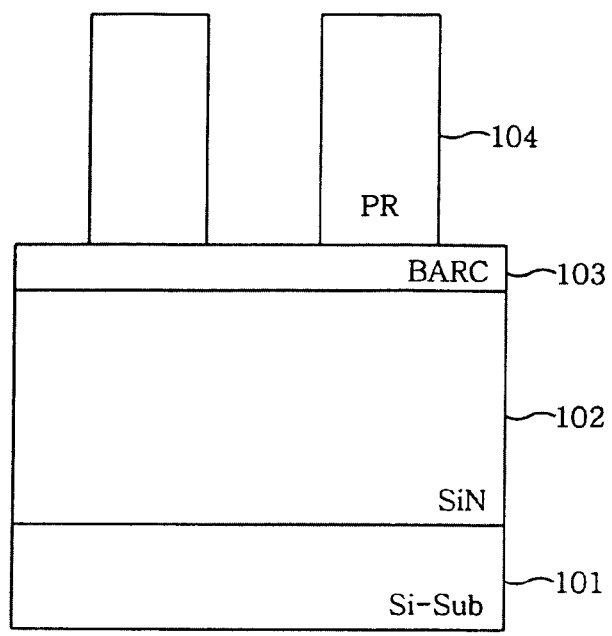
FIG. 10 is a view illustrating one example of a sample structure used in actually making the etching characteristics uniform in accordance with the present invention.

Referring to FIG. 10, a wafer sample was obtained by laminating a SiN film 102 as a hard mask, an anti-reflection film (BARC) 103 and a photoresist film (PR) 104 in that order on a Si substrate 101 and then patterning the photoresist film 104 through a photolithography process. The anti-reflection film 103 and the SiN film 102 were etched by the plasma etching apparatus shown in FIG. 1.

As the common conditions for etching the reflection film 103 and the SiN film 102, the wafer was kept at a temperature of 60° C. and the flow rate ratio of the processing gas supplied toward the central region and the edge region was set to be 45:55. During the process of plasma-etching the anti-reflection film 103, a $CF_4$ gas, an Ar gas and an $O_2$ gas were supplied as the processing gas at the flow rates of 120 mL/min (sccm), 420 mL/min (sccm) and 15 mL/min (sccm), respectively. The pressure in the chamber was set to 13.3 Pa (100 mTorr), and the high frequency power was set to 800 W. When plasma-etching the SiN film 102, a $CH_2F_2$ gas, a $CF_4$ gas, an Ar gas and an $O_2$ gas were supplied as the processing gas at the flow rates of 20 mL/min (sccm), 80 mL/min (sccm), 150 mL/min (sccm) and 20 mL/min (sccm), respectively. Further, a $CH_2F_2$ gas capable of generating a CN-based reaction product was supplied as the additional gas toward the region outside the outer edge of the wafer through the third gas diffusion space 40c at the flow rate of 2 mL/min (sccm). The pressure in the chamber was set to 18.6 Pa (140 mTorr), and the high frequency power was set to 700 W. When plasma-etching the anti-reflection film 103, the processing gas was supplied through the third gas diffusion space 40c.

As a result, when etching the SiN film 102, the critical dimension in the outermost circumferential portion of the wafer was corrected with the help of the reaction of the $CH_2F_2$ gas used as the additional gas. Thus, it was possible to perform the etching operation with increased uniformity. Despite the fact that the additional gas was not supplied during the etching of the anti-reflection film 103, neither abnormal electric discharge nor deposit was generated because the processing gas was injected from the third gas diffusion space 40c for use in supplying the additional gas.

Figure 11:
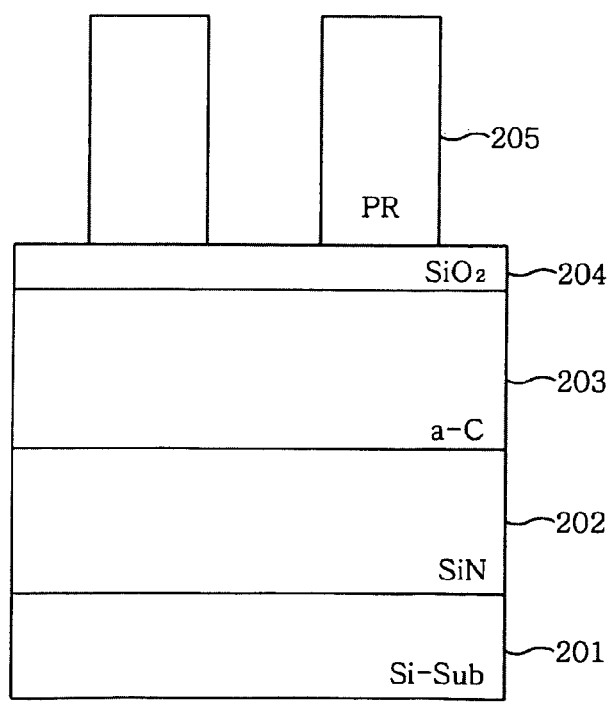
FIG. 11 is a view illustrating another example of a sample structure used in actually making the etching characteristics uniform in accordance with the present invention.

Referring next to FIG. 11, a wafer sample was obtained by laminating a SiN film 202 as a hard mask, an amorphous carbon (a-C) film 203, a $SiO_2$ film 204 and a photoresist film (PR) 205 in that order on a Si substrate 201 and then patterning the photoresist film 205 through a photolithography process. The $SiO_2$ film 204 and the amorphous carbon film 203 were etched by the plasma etching apparatus shown in FIG. 1.

As the common conditions for etching the $SiO_2$ film 204 and the amorphous carbon film 203, the wafer was kept at a temperature of 20° C. and the flow rate ratio of the processing gas supplied toward the central region and the edge region was set to 50:50. During the plasma-etching of the $SiO_2$ film 204, a $CF_4$ gas was supplied as the processing gas at the flow rate of 150 mL/min (sccm). The pressure in the chamber was set to 10.6 Pa (80 mTorr), and the high frequency power was set to 400 W. When plasma-etching the amorphous carbon film 203, an $O_2$ gas and an Ar gas were supplied as the processing gas at the flow rates of 180 mL/min (sccm) and 300 mL/min (sccm), respectively. Furthermore, a CO gas capable of increasing the film ingredients in the etching atmosphere was supplied as the additional gas toward the region outside the outermost peripheral region of the wafer through the third gas diffusion space 40c at the flow rate of 200 mL/min (sccm). The pressure within the chamber was set to 4.0 Pa (30 mTorr), and the high frequency power was set equal to 500 W. When plasma-etching the $SiO_2$ film 204, the processing gas was supplied through the third gas diffusion space 40c.

As a result, when etching the amorphous carbon film 203, the critical dimension in the outermost circumferential portion of the wafer was corrected with the help of the reaction of the CO gas as the additional gas. Thus, it was possible to perform the etching operation with increased uniformity. Despite the fact that the additional gas was not supplied during the etching of the $SiO_2$ film 204, neither abnormal electric discharge nor deposit was generated because the processing gas was injected from the third gas diffusion space 40c for use in supplying the additional gas.

Figure 12:
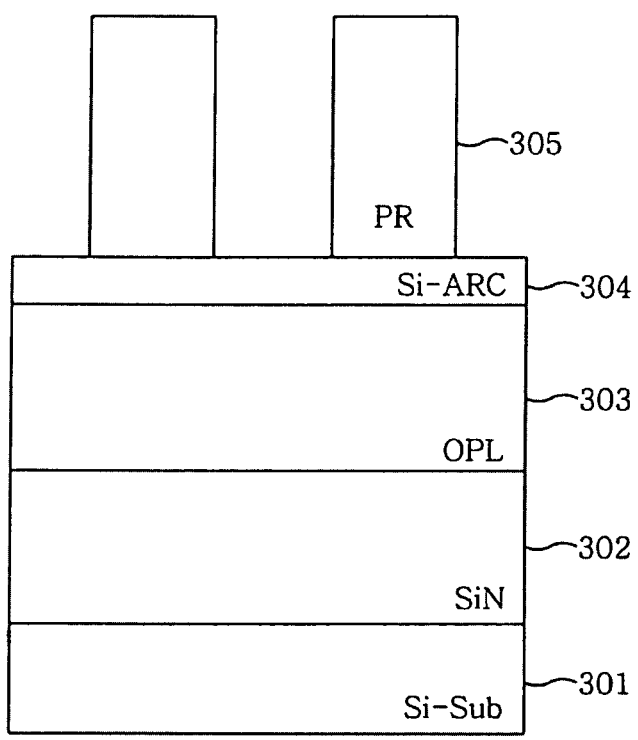
FIG. 12 is a view illustrating a further example of a sample structure used in actually making the etching characteristics uniform in accordance with the present invention.

Next, a wafer sample shown in FIG. 12 was obtained by laminating a SiN film 302 as a hard mask, a polyvinyl alcohol-based resin film (OPL) 303, an anti-reflection film (Si-ARC) 304 and a photoresist film (PR) 305 in that order on a Si substrate 301 and then patterning the photoresist film 305 through a photolithography process. The anti-reflection film 304 and the polyvinyl alcohol-based resin film 303 were etched by the plasma etching apparatus shown in FIG. 1.

As the common conditions for etching the anti-reflection film 304 and the polyvinyl alcohol-based resin film 303, the wafer was kept at a temperature of 20° C. and the flow rate ratio of the processing gas supplied toward the central region and the edge region was set to 50:50. During the plasma-etching of the anti-reflection film 304, a $CF_4$ gas was supplied as the processing gas at the flow rate of 150 mL/min (sccm). The pressure in the chamber was set to 10.6 Pa (80 mTorr), and the high frequency power was set to 400 W. When plasma-etching the resin film 303, a $N_2$ gas, an $O_2$ gas and a $H_2$ gas were supplied as the processing gas at the flow rates of 200 mL/min (sccm), 18 mL/min (sccm) and 100 mL/min (sccm), respectively. Further, a CO gas capable of increasing the film ingredients in the etching atmosphere was supplied as the additional gas toward the region outside the outer edge of the wafer through the third gas diffusion space 40c at the flow rate of 40 mL/min (sccm). The pressure in the chamber was set to 2.3 Pa (17 mTorr), and the high frequency power was set to 300 W. When plasma-etching the anti-reflection film 304, the processing gas was supplied through the third gas diffusion space 40c.

As a result, when etching the polyvinyl alcohol-based resin film 303, the critical dimension in the outermost circumferential portion of the wafer was corrected with the help of the reaction of the CO gas used as the additional gas. Thus, it was possible to perform the etching operation with increased uniformity. Despite the fact that the additional gas was not supplied during the etching of the anti-reflection film 304, neither abnormal electric discharge nor deposit was generated because the processing gas was injected from the third gas diffusion space 40c for use in supplying the additional gas.

The present invention is not limited to embodiment described above and various modification may be made. For example, the processing gas may be split to flow toward three or more regions, although the processing gas is split into two to flow toward the first gas inlet portion 51 corresponding to the central region of the wafer and the second gas inlet portion 52 corresponding to the peripheral region of the wafer in the above embodiment. Further, the gas inlet portions are not necessarily arranged in a concentric pattern. In addition, although the processing gas and the additional gas are introduced through the shower head 16 in the above embodiment, they may be introduced through, e.g., gas lines, in place of the shower head.

While the above embodiment is directed to plasma etching, the present invention is not limited thereto. Alternatively, the present invention may be applied to other plasma processing such as plasma CVD and the like or non-plasma processing such as thermal CVD and the like.

While the semiconductor wafer is used as the target substrate in the above embodiment, the present invention is not limited thereto. Other substrates such as a substrate for flat panel displays and the like may be used as the target substrate.

What is claimed is:

1. A gas supply device for supplying a gas into a processing chamber in which a target substrate is arranged, comprising:
   a gas introduction member including therein a gas diffusion space, through which the gas is introduced into the processing chamber, the gas diffusion space having a first gas diffusion space positioned at a central region of the gas introduction member, a second as diffusion space positioned outside the first as diffusion space, and a third gas diffusion space positioned outside the second gas diffusion space;
   a processing gas supply unit configured to supply a processing gas into the gas introduction member, the processing gas being used to process the target substrate;
   a processing gas supply path, connected to the processing gas supply unit, through which the processing gas flows from the processing gas supply unit;
   branch paths branched off from the processing gas supply path and connected to the gas introduction member, the branch paths having a first branch path configured to supply only the processing gas to the first gas diffusion space and a second branch path configured to supply only the processing gas to the second gas diffusion space;
   an additional gas supply unit configured to supply an additional gas into the gas introduction member, the additional gas being used to adjust processing characteristics of the processing gas;
   an additional gas supply path separate from the branch paths, and connected to the additional gas supply unit and the gas introduction member, through which the additional gas flows from the additional gas supply unit to the third gas diffusion space;
   a branch flow controller having a first flow rate control valve and a first pressure sensor in the first branch path, and having a second flow rate control valve and a second pressure sensor in the second branch path;
   a bypass passage configured to connect the second branch path to the additional gas supply path; and
   a bypass valve arranged at at least one of the bypass passage and the additional gas supply path,
   wherein, in a case where the additional gas is introduced into the processing chamber, the bypass valve is configured to disconnect the third gas diffusion space from the bypass passage so that the additional gas is supplied into the third gas diffusion space, and, in a case where the additional gas is not introduced into the processing chamber, the bypass valve is configured to disconnect the third gas diffusion space from the additional gas supply unit so that the processing gas is supplied into the third gas diffusion space through the bypass passage, and
   wherein the branch flow controller is configured to control a ratio of a flow rate of the processing gas supplied through the first branch path to that of the processing gas supplied through the second branch path by adjusting an opening degree of each of the first and the second flow rate control valves based on the first and the second pressure sensors.

2. The gas supply device of claim 1, wherein the gas introduction member includes gas inlet portions having a first gas inlet portion formed with the first gas diffusion space, a second gas inlet portion formed with the second gas diffusion space, and a third gas inlet portion formed with the third gas diffusion space, and
   wherein the gas inlet portions are provided in a concentric pattern.

3. The gas supply device of claim 1, wherein the gas introduction member constitutes a shower head having gas injection holes formed at a bottom thereof.

4. A gas supply device for supplying a gas into a processing chamber in which a target substrate is arranged, comprising:
   a gas introduction member configured to introduce the gas into the processing chamber;
   one or more gas inlet portions provided at a bottom portion of the gas introduction member, the gas inlet portions having a first gas inlet portion positioned at a central region of the gas introduction member, a second gas inlet portion positioned outside the first gas inlet portion, and a third gas inlet portion positioned outside the second gas inlet portion;
   a processing gas supply unit configured to supply a processing gas to the gas introduction member, the processing gas being used to process the target substrate;
   a processing gas supply path, connected to the processing gas supply unit, through which only the processing gas is supplied from the processing gas supply unit to the one or more gas inlet portions;
   branch paths branched off from the processing gas supply path and connected to the gas introduction member, the branch paths having a first branch path configured to supply only the processing gas to the first gas inlet portion, and a second branch path configured to supply only the processing gas to the second gas inlet portion;
   an additional gas supply unit configured to supply an additional gas to the gas introduction member, the additional gas being used to adjust processing characteristics of the processing gas;
   an additional gas supply path, separate from the processing gas supply path, and connected to the additional gas supply unit and the gas introduction member, through which the additional gas is supplied from the additional gas supply unit to the third gas inlet portion;
   a branch flow controller having a first flow rate control valve and a first pressure sensor in the first branch path, and having a second flow rate control valve and a second pressure sensor in the second branch path;
   a bypass passage configured to connect the second branch path to the additional gas supply path; and
   a bypass valve arranged at at least one of the bypass passage and the additional gas supply path,
   wherein, in a case where the additional gas is introduced into the processing chamber, the bypass valve is configured to disconnect the gas introduction member from the bypass passage so that the additional gas is supplied to the third gas inlet portion, and, in a case where the additional gas in not introduced into the processing chamber, the bypass valve is configured to disconnect the gas introduction member from the additional gas supply unit so that the processing gas is supplied into the third gas inlet portion through the bypass passage, and
   wherein the branch flow controller is configured to control a ratio of a flow rate of the processing gas supplied through the first branch path to that of the processing gas supplied through the second branch path by adjusting an opening degree of each of the first and the second flow rate control valves based on the first and the second pressure sensors.

5. The gas supply device of claim 4, wherein the gas introduction member includes therein a gas diffusion space, and wherein the gas introduction member constitutes a shower head having gas injection holes formed at a bottom thereof, the gas injection holes corresponding to the gas diffusion space.

6. The gas supply device of claim 1, wherein the additional gas differs from the processing gas.

7. The gas supply device of claim 1, wherein the processing gas comprises plural gases, the additional gas differing from the gases or being a part of the gases which form the processing gas.

8. A substrate processing apparatus comprising:
a processing chamber in which a target substrate is arranged; and
a gas supply device configured to supply a gas into the processing chamber, wherein a processing gas used to process the target substrate is supplied from the gas supply device into the processing chamber to perform a specific processing onto the target substrate, the gas supply device including
a gas introduction member including therein a gas diffusion space, through which the gas is introduced into the processing chamber, the gas diffusion space having a first gas diffusion space positioned at a central region of the gas introduction member, a second gas diffusion space positioned outside the first gas diffusion space, and a third as diffusion space positioned outside the second as diffusion space;
a processing gas supply unit configured to supply the processing gas into the gas introduction member;
a processing gas supply path, connected to the processing as supply unit, through which the processing gas flows from the processing gas supply unit;
branch paths branched off from the processing gas supply path and connected to the gas introduction member, the branch paths having a first branch path configured to supply only the processing gas to the first gas diffusion space, and a second branch path configured to supply only the processing gas to the second gas diffusion space;
an additional gas supply unit configured to supply an additional gas into the gas introduction member, the additional gas being used in adjusting processing characteristics of the processing gas;
an additional gas supply path separate from the branch paths and connected to the additional gas supply unit and the gas introduction member, through which the additional gas flows from the additional gas supply unit to the third gas diffusion space;
a branch flow controller having a first flow rate control valve and a first pressure sensor in the first branch path, and having a second flow rate control valve and a second pressure sensor in the second branch path;
a bypass passage configured to connect the second branch path to the additional gas supply path; and
a bypass valve arranged at at least one of the bypass passage and the additional gas supply path,
wherein, in a case where the additional gas is introduced into the processing chamber, the bypass valve is configured to disconnect the third gas diffusion space from the bypass passage so that the additional gas is supplied into the third gas diffusion space, and, in a case where the additional gas is not introduced into the processing chamber, the bypass valve is configured to disconnect the third gas diffusion space from the additional gas supply unit so that the processing gas is supplied into the third gas diffusion space through the bypass passage, and
wherein the branch flow controller is configured to control a ratio of a flow rate of the processing gas supplied through the first branch path to that of the processing gas supplied through the second branch path by adjusting an opening degree of each of the first and the second flow rate control valves based on the first and the second pressure sensors.

9. A substrate processing apparatus comprising:
a processing chamber in which a target substrate is arranged; and
a gas supply device configured to supply a gas into the processing chamber, wherein a processing gas used to process the target substrate is supplied from the gas supply device into the processing chamber to perform a specific processing onto the target substrate, the gas supply device including
a gas introduction member configured to introduce the gas into the processing chamber;
one or more gas inlet portions provided at a bottom portion of the gas introduction member, the gas inlet portions having a first gas inlet portion positioned at a central region of the gas introduction member, a second gas inlet portion positioned outside the first gas inlet portion, and a third gas inlet portion positioned outside the second gas inlet portion;
a processing gas supply unit configured to only supply the processing gas to the gas introduction member, the processing gas being used to process the target substrate;
a processing gas supply path, connected to the processing gas supply unit, through which only the processing gas is supplied from the processing gas supply unit to the one or more gas inlet portions;
branch paths branched off from the processing gas supply path and connected to the gas introduction member, the branch paths having a first branch path configured to supply only the processing gas to the first gas inlet portion, and a second branch path configured to supply only the processing gas to the second gas inlet portion;
an additional gas supply unit configured to supply an additional gas to the gas introduction member, the additional gas being used in adjusting processing characteristics of the processing gas;
an additional gas supply path, separate from the processing gas supply path, and connected to the additional gas supply unit and the gas introduction member, through which the additional gas is supplied from the additional gas supply unit to the third gas inlet portion; and
a branch flow controller having a first flow rate control valve and a first pressure sensor branch path, and having a second flow rate control valve and a second pressure sensor in the second branch path;
a bypass passage configured to connect the second branch path to the additional gas supply path; and
a bypass valve arranged at at least one of the passage and the additional gas supply path,
wherein, in a case where the additional gas is introduced into the processing chamber, the bypass valve is configured to disconnect the gas introduction member from the bypass passage so that the additional gas is supplied to the third gas inlet portion, and, in a case where the additional gas is not introduced into the processing chamber, the bypass valve is configured to disconnect the gas introduction member from the additional gas supply unit so that the processing gas is supplied into the third gas inlet through the bypass passage, and wherein the branch flow controller is configured to control a ratio of a flow rate of the processing gas supplied through the first branch path to that of the processing gas supplied through the second branch path by adjusting an opening degree of each of the first and the second flow rate control valves based on the first and the second pressure sensors.

10. The gas supply device of claim 1, wherein the gas introduction member includes a first and a second annular partition wall member, and wherein the gas diffusion space is divided into the first and the second gas diffusion space by the first annular partition wall member, and is divided into the second and the third gas diffusion space by the second annular partition wall member.

11. The gas supply device of claim 5, wherein the gas diffusion space includes a first gas diffusion space positioned at a central region of the gas introduction member, a second gas diffusion space positioned outside the first gas diffusion space, and a third gas diffusion space positioned outside the second gas diffusion space, wherein the gas introduction member includes a first and a second annular partition wall member, and wherein the gas diffusion space is divided into a first gas diffusion space and a second gas diffusion space by the first annular partition wall member, and is divided into the second gas diffusion space and a third gas diffusion space by the second annular partition wall member.

12. The substrate processing apparatus of claim 8, wherein the gas introduction member includes a first and a second annular partition wall member, and wherein the gas diffusion space is divided into the first and the second gas diffusion space by the first annular partition wall member, and is divided into the second and the third gas diffusion space by the second annular partition wall member.

13. The substrate processing apparatus of claim 9, wherein the gas introduction member includes a gas diffusion space having a first gas diffusion space positioned at a central region of the gas introduction member, a second gas diffusion space positioned outside the first gas diffusion space, and a third gas diffusion space positioned outside the second gas diffusion space, wherein the gas introduction member includes a first and a second annular partition wall member, and wherein the gas diffusion space is divided into the first and the second gas diffusion space by the first annular partition wall member, and is divided into the second and the third gas diffusion space by the second annular partition wall member.

14. A gas supply device for supplying a gas into a processing chamber in which a target substrate is arranged, comprising:

a processing gas supply unit configured to supply a processing gas into the processing chamber;

a processing gas supply path, connected to the processing gas supply unit, through which the processing gas flows from the processing gas supply unit;

branch paths branched off from the processing gas supply path and connected to the processing chamber, the branch paths having a first branch path and a second branch path;

an additional gas supply unit configured to supply an additional gas into the processing chamber;

an additional gas supply path connected to the additional gas supply unit and connected to the processing chamber, through which the additional gas flows from the additional gas supply unit;

a branch flow controller having a first flow rate control valve and a first pressure sensor in the first branch path, and having a second flow rate control valve and a second pressure sensor in the second branch path;

a bypass passage configured to connect the second branch path to the additional gas supply path; and a bypass valve arranged at at least one of the bypass passage and the additional gas supply path, wherein, in a case where the additional gas is introduced into the processing chamber, the bypass valve is configured to disconnect the processing chamber from the bypass passage so that the additional gas is supplied into the processing chamber through the additional gas supply path, and, in a case where the additional gas is not introduced into the processing chamber, the bypass valve is configured to disconnect the processing chamber from the additional gas supply unit so that the processing gas is supplied into the processing chamber through the bypass passage, and wherein the branch flow controller is configured to control a ratio of a flow rate of the processing gas supplied through the first branch path to that of the processing gas supplied through the second branch path by adjusting an opening degree of each of the first and the second flow rate control valve based on the first and the second pressure sensor.

15. The gas supply device of claim 1, wherein the bypass valve is arranged at a junction point of the bypass passage and the additional gas supply path.

16. The gas supply device of claim 4, wherein the bypass valve is arranged at a junction point of the bypass passage and the additional gas supply path.

17. The gas supply device of claim 5, wherein the bypass valve is arranged at a junction point of the bypass passage and the additional gas supply path.

18. The substrate processing apparatus of claim 8, wherein the bypass valve is arranged at a junction point of the bypass passage and the additional gas supply path.

19. The substrate processing apparatus of claim 9, wherein the bypass valve is arranged at a junction point of the bypass passage and the additional gas supply path.

20. The gas supply device of claim 14, wherein the bypass valve is arranged at a junction point of the bypass passage and the additional gas supply path.

* * * * *